United States Patent
Yoshida et al.

(10) Patent No.: US 7,480,229 B2
(45) Date of Patent: Jan. 20, 2009

(54) LIGHT-EMITTING DEVICE AND OPTICAL INTEGRATED DEVICE

(75) Inventors: Takehito Yoshida, Kawasaki (JP); Yuka Yamada, Kawasaki (JP); Nobuyasu Suzuki, Kawasaki (JP); Toshiharu Makino, Kawasaki (JP)

(73) Assignee: Panasonic Corporation, Osaka (JP)

(*) Notice: Subject to any disclaimer, the term of this patent is extended or adjusted under 35 U.S.C. 154(b) by 315 days.

(21) Appl. No.: 11/408,062

(22) Filed: Apr. 21, 2006

(65) Prior Publication Data

US 2006/0187992 A1    Aug. 24, 2006

Related U.S. Application Data

(62) Division of application No. 10/754,504, filed on Jan. 12, 2004, now Pat. No. 7,099,261, which is a division of application No. 09/901,575, filed on Jul. 11, 2001, now abandoned.

(30) Foreign Application Priority Data

Jul. 14, 2000 (JP) .............................. 2000-214331
Jul. 14, 2000 (JP) .............................. 2000-214332

(51) Int. Cl.
*G11B 7/00* (2006.01)
(52) U.S. Cl. .................................. 369/112.27; 369/121
(58) Field of Classification Search .................. None
See application file for complete search history.

(56) References Cited

U.S. PATENT DOCUMENTS 6,239,453 B1    5/2001    Yamada et al.
6,607,277 B2    8/2003    Yokoyama et al.

FOREIGN PATENT DOCUMENTS

| EP | 0 853 334 | 7/1998 |
| JP | 62-051045 | 3/1987 |
| JP | 62-500620 | 3/1987 |
| JP | 02-308423 | 12/1990 |
| JP | 8-213659 A | 8/1995 |
| JP | 10-214995 A | 8/1998 |
| WO | WO 86/02767 | 5/1986 |

*Primary Examiner*—Paul Huber
(74) *Attorney, Agent, or Firm*—Browdy and Neimark, P.L.L.C.

(57) ABSTRACT

In fabricating a monochromic and highly coherent light source, no single crystalline bulk semiconductor is used, but two different kinds of transparent substances are alternately stacked over each other to constitute a periodic structure in ½ of the intended wavelength. At least one of the two kinds of transparent substances is controllable in electric conductivity, and the structure is such that inside a medium consisting of this kind of transparent substance light-emitting semiconductor particulates are embedded. Accordingly, a light-emitting device has this structure, which makes possible control of the center wavelength of light emission, the width of wavelength distribution and coherence by adjusting the geometrical parameters of the device without having to alter the kind of material use.

4 Claims, 5 Drawing Sheets

LIGHT-EMITTING DEVICE AND OPTICAL INTEGRATED DEVICE

RELATED APPLICATIONS

The present application is a division of parent application Ser. No. 10/754,504, filed Jan. 12, 2004, itself a division of grandparent application Ser. No. 09/901,575, filed Jul. 11, 2001, now abandoned.

BACKGROUND OF THE INVENTION

1. Field of the Invention

The present invention relates to a light-emitting device and an optical integrated device, and more particularly to a light-emitting device and an optical integrated device having superior characteristics which enable an optical picking-up function for realizing a high level of space resolution to be achieved by a small, light-weight, less power-consuming and highly ambience-resistant device fabricated in a monolithic process.

2. Description of the Prior Art

As an example of the prior art, an optical pickup device matching optical disk type recording media, which now constitutes the mainstream of such elements, will be described. FIG. 1 illustrates the basic configuration of a currently mainstream optical pickup. The configuration and operation of this type pickup, which is extensively used by those engaged in the art, are described in, for instance, *Applied Physics*, Vol. 67, No. 9 (1998), pp. 1035-1040 (in Japanese). A probe light emitted from a semiconductor laser 101, traveling via a diffraction grating 102, is folded 90 degrees by a half mirror 103, and is condensed by an objective lens 104 to irradiate the upper surface of an optical disk 105. The incident probe light is reflected and scattered by a pattern drawn on the surface of the optical disk 105. Lights reflected or scattered backward are condensed by the objective lens 104, the condensed light is transmitted straight by the half mirror 103, and its intensity is detected by a photodiode 106 arranged behind. The semiconductor laser 101, which serves as the light source, uses a wavelength of 780 nm (for a compact disk (CD) or a Mini Disk (MD)) or 635-650 nm (for a digital versatile disk (DVD)), depending on the type of the optical disk 105. Regions of two different reflection factors are written on the surface of the optical disk 105 with a precision of the μm level. Relative intensities of reflected lights resulting from the irradiation with the probe light are detected and translated into digital signals. A space resolution d with respect to the reading of write patterns can be expressed in the following equation, wherein λ is the wavelength of the probe light and NA, the numerical aperture of the objective lens:

$$d = 0.7 \lambda / NA \quad (1)$$

The shorter the wavelength λ of the probe light and the greater the numerical aperture NA of the objective lens, the higher the space resolution, i.e. the denser the recording by the memory. The NA of optical pickup device commercially available today is about 0.45 for CDs and 0.6 for DVDs. The above-described optical pickup device is configured by assembling individual basic components including the semiconductor laser 101, diffraction grating 102, half mirror 103, objective lens 104 and photodiode 106.

However, there are limits to reductions in size, weight and power consumption of the above-described optical pickup device according to the prior art, because basically it is fabricated in a process of assembling discrete components. Further, in order to enhance the space resolution, an indispensable requirement for increasing the recording density, it is necessary to increase the aperture rate of the objective lens or to shorten the wavelength of the semiconductor laser, which is the light source. The former would inevitably result in a greater hardware size, while the latter, as it requires development back to the stage of growth of new type single semiconductor crystals excelling in material composition, would be enormously time-consuming and expensive. These are essential impediments to functional upgrading.

SUMMARY OF THE INVENTION

For a light-emitting device according to the present invention, in order to solve the above-noted problems with the prior art, no single crystalline bulk semiconductor is used in fabricating a monochromic and highly coherent light source, but two different kinds of transparent substances are alternately stacked over each other to constitute a periodic structure in ½ of the intended wavelength. At least one of the two kinds of transparent substances is controllable in electric conductivity, and the structure is such that inside a medium consisting of this kind of transparent substance light-emitting semiconductor particulates are embedded. This structure makes possible control of the center wavelength of light emission, the width of wavelength distribution and coherence by adjusting the geometrical parameters of the device without having to alter the kind of the material used.

An optical integrated device according to the invention uses a configuration in which two symmetrical lines of incident probe lights with respect to a perpendicular axis from irradiation points on the surface of an object come incident on the object surface at small angles of elevation, and employs a means which condense lights reflected, scattered. or diffracted on the object surface and feeds them back for detection to an active region within the light source belonging to the probe light emitting lines. This means has a configuration simulating a confocal optical system, and makes possible an optical pickup type optical integrated device capable of significantly high space resolution.

An optical integrated device according to the invention further has a configuration in which, centering on a monochromic and coherent small light-emitting device, optical devices including an optical waveguide, an optical condenser and a light receiving device are integrally formed in a monolithic process. This results in an optical integrated device for use as an optical pickup, which is extremely small, light, electric power-efficient and ambience-resistant and yet capable of significantly high space resolution.

A light-emitting device according to the invention emits light by electrical excitation and has a periodic structure in which first dielectrics transparent in the light-emitting wavelength range of the characteristic of the above-mentioned light emission and second dielectrics having a different dielectric constant from the first dielectrics are alternately combined. Accordingly, a simply structured light-emitting device is implemented.

Structuring here the combination of the first dielectrics and the second dielectrics in units of half periods of the wavelength of light emission from the first dielectrics makes it possible to realize a light-emitting device superior in monochrome and coherence.

Also, a structure of the light-emitting first dielectrics in which light-emitting semiconductor particulates are uniformly dispersed in these dielectric media makes it possible to realize a light-emitting device of which the center wavelength of light emission can be controlled by adjusting such geometric parameters as the particle size, surface condition and packing density of the semiconductor micro-particulates.

In addition, the structure of the light-emitting first dielectrics in which light-emitting semiconductor particulates are uniformly dispersed in transparent media enables the light-emitting semiconductor particulates to effectively perform current excitation if the transparent media are electroconductive and their electrical conductivity is set lower than that of the semiconductor particulates.

Furthermore, the light-emitting device has a periodic structure in which the first dielectrics emit light when excited by electrical excitation and are transparent in the light-emitting wavelength range of the characteristic of the light emission and the second dielectrics having a different dielectric constant from the first dielectrics are alternately combined. The light-emitting device serves as a light source having a narrow width of wavelength distribution and high coherence. The integral formation of this light-emitting device with such optical components as a light-receiving device, micro-lenses for collimating and condensation, and a hologram device implements an extremely small, light, electric power-efficient and ambience-resistant optical integrated device.

The optical integrated device according to the invention can exert its useful characteristics most effectively when enabled to manifest an optical pickup function.

An optical integrated device according to the invention may also have a configuration wherein a probe light from a first light source comes incident obliquely at a prescribed angle to an axis perpendicular to an object surface and reaches an irradiation point, a second light source of the same specification as the first light source is arranged in a position axially symmetrical to the perpendicular axis, and a probe light from the second light source, similar to the probe light from the first light source, reaches the irradiation point. The configuration further features the arrangement of two lines of irradiating probe lights, having an optical pickup function and symmetrical with respect to the perpendicular axis starting from the irradiation point on the object surface. This configuration makes it possible to realize an optical pickup type optical integrated device manifesting a high level of space resolution.

Furthermore, the incidence of these symmetric two lines of probe lights on the object at an angle of 40 degrees or more to each other, i.e. at an angle of elevation of 70 degrees or less from the object surface results in an optical system simulating the use of a large aperture lens, making it possible to realize an optical pickup type optical integrated device manifesting a significantly high level of space resolution.

An optical integrated device according to the invention may also have a configuration in which the irradiation point is defined on the object surface; two probe light irradiating lines symmetrical with respect to a perpendicular line starting from this irradiation point are provided; the two probe light lines reach and come incident on the irradiation point at a prescribed angle to each other; and lights resulting from the reflection, scattering and diffraction of the probe lights from the object surface are condensed and re-introduced into light sources belonging to the probe light irradiating lines to be fed back to and detected in an active region. The condensation of the lights resulting from the reflection, scattering and diffraction of the symmetric two lines of probe lights on the object surface and feeding back them into and detecting them in the active region within the light sources belonging to the probe light irradiating lines constitutes a simulated confocal optical system. It is possible to realize a high level of space resolution with a significantly small, light, electric power-efficient and ambience-resistant optical integrated device.

An optical integrated device according to the invention may as well be provided with a first probe light irradiating line so configured that a probe light from a first light source is introduced into an optical waveguide and transmitted, comes incident via an objective lens obliquely at a prescribed angle to a perpendicular axis to an object surface and reaches an irradiation point, and a second probe light irradiating optical line having the same configuration as this first probe light irradiating line. These first probe light irradiating line and second probe light irradiating optical line are arranged in symmetric positions with respect to the perpendicular axis. The arrangement of the two probe light irradiating optical lines in axially symmetric positions constitutes a simulated confocal optical system, making it possible to realize a high level of space resolution with a significantly small, light, electric power-efficient and ambience-resistant optical integrated device.

An optical integrated device according to the invention may also have such a configuration that two probe light irradiating optical lines, on which probe lights from light sources are introduced into an optical waveguide and transmitted, come incident via an objective lens obliquely at a prescribed angle to a perpendicular axis to an object surface and reach an irradiation point, are arranged in axially symmetric positions. The condensation of the lights resulting from the reflection, scattering and diffraction of the probe lights on the object surface and feeding back them into and detecting them in the active region within the light sources belonging to the probe light irradiating lines constitutes a simulated confocal optical system. It is possible to realize a high level of space resolution with a significantly small, light, electric power-efficient and ambience-resistant optical integrated device.

Further providing the above-described optical integrated device with an optical pickup function makes it possible to fabricate a small and light optical pickup type optical integrated device capable of extremely high space resolution.

As described above, according to the invention, no single crystalline bulk semiconductor is used in fabricating a monochromic and highly coherent light source, but two different kinds of transparent substances are alternately stacked over each other to constitute a periodic structure in ½ of the intended wavelength. At least one of the two kinds of transparent substances is controllable in electric conductivity, and the structure is such that inside a medium consisting of this kind of transparent substance light-emitting semiconductor particulates are embedded. This structure makes it possible to control the center wavelength of light emission, the width of wavelength distribution and coherence by adjusting the geometrical parameters of the device without having to alter the kind of the material used.

The optical integrated device according to the invention has a configuration in which two lines of incident probe lights, symmetric to each other with respect to the perpendicular axis from the irradiation point on the object surface, come incidence on the object surface at a relative small angle of elevation, and lights reflected, scattered or diffracted on the object surface are condensed, and fed back for detection to an active region within the light source belonging to the probe light emitting lines. This makes possible an optical pickup type optical integrated device capable of significantly high space resolution.

The optical integrated device according to the invention further has a configuration in which, centering on a monochromic and coherent small light-emitting device which may typically be a semiconductor laser chip or a photonic crystal light-emitting device, optical device including an optical waveguide, an optical condenser and a light receiving device are integrally formed in a monolithic process. This results in an optical integrated device for use as an optical pickup, which is extremely small, light, electric power-efficient and ambience-resistant and yet capable of significantly high space resolution.

Therefore, an object of the present invention is to solve the above-noted problem by providing a superior light-emitting device and optical integrated device capable of realizing an optical picking-up function to achieve a particularly high level of space resolution with an extremely small, light, electric power-efficient and ambience-resistant device fabricated in a monolithic process.

BRIEF DESCRIPTION OF THE DRAWINGS

These and other objects and advantages of the invention will become more apparent from the following description of the preferred embodiments thereof when taken in conjunction with accompanying drawings, wherein.

DESCRIPTION OF THE PREFERRED EMBODIMENTS

The preferred embodiments of the present invention will be described below with reference to FIG. 2 through FIG. 5.

First Embodiment

Figure 1:
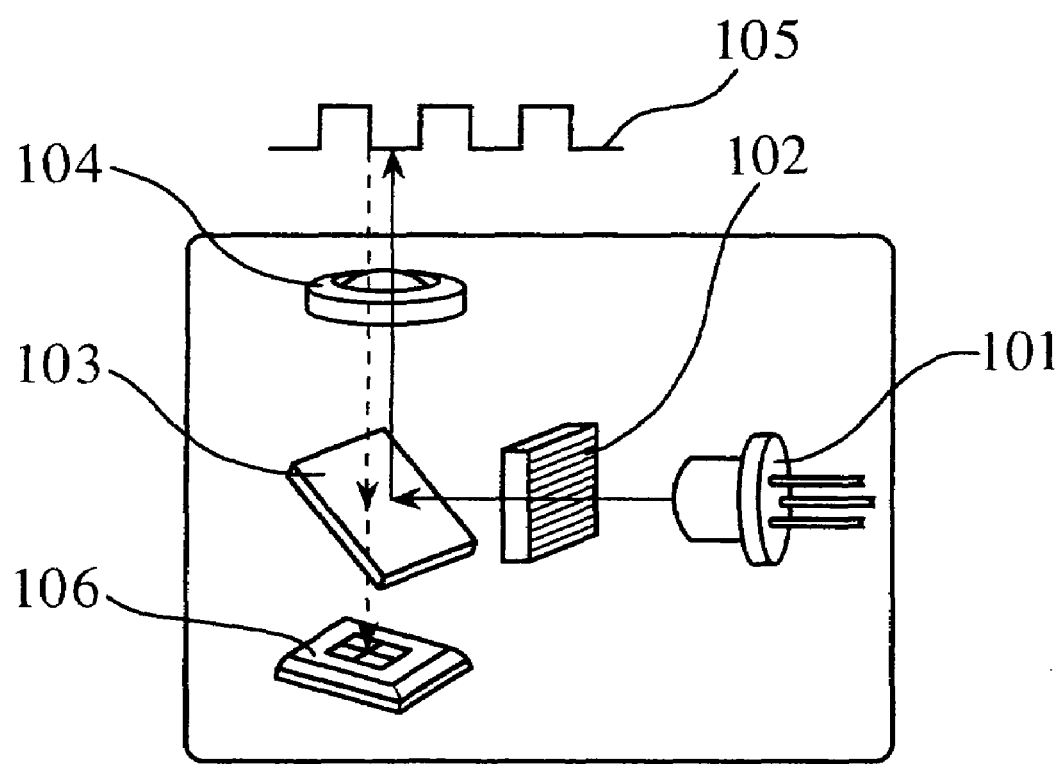
FIG. 1 illustrates the configuration of an assembled optical pickup device according to the prior art.
Figure 2:
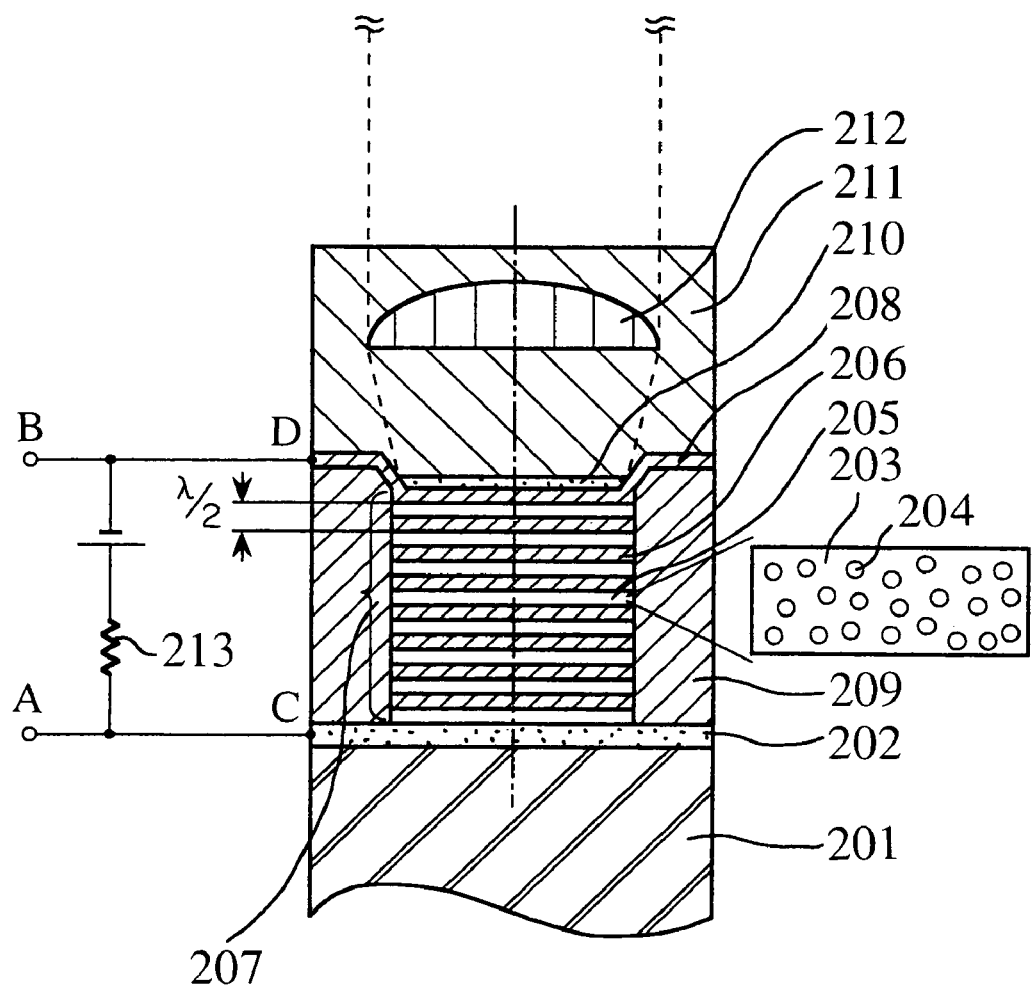
FIG. 2 shows a sectional view of the structure of a light-emitting device, which is a first preferred embodiment of the invention.

FIG. 2 shows a sectional view of the structure of a light-emitting device, which is the first preferred embodiment of the invention. Referring to FIG. 2, over the surface of a single crystalline silicon (Si) substrate 201, a tungsten silicide (WSi$_2$) layer of 150 nm in film thickness is formed as a lower reflecting electrode 202 concurrently serving as a lower electrode and a total reflection mirror. Over this lower reflecting electrode 202 are formed light-emitting transparent conductor layers 205 each configured by uniformly dispersing in a tin oxide (SnO$_2$) medium 203 Si nanoparticules 204 of 2 nm in average particle size at a packing density of 5% and non-light-emitting transparent conductor layers 206 consisting of titanium oxide (TiO$_2$) are alternately stacked, resulting a total of eight pairs of layers.

The optical film thickness (period) of a light-emitting transparent conductor layer 205/non-light-emitting transparent conductor layer 206 pair is set to ½ of the center wavelength λ (400 nm) spontaneously emitted by the light-emitting transparent conductor layer 205. Here, the refractive index corresponding to a wavelength of 400 nm is 2.3 for the light-emitting transparent conductor layer 205, and 3.0 for the non-light-emitting transparent conductor layer 206. Therefore, the real film thickness of the pair is 77 nm.

The refractive index of the light-emitting transparent conductor layer 205 is the average effective dielectric constant of a solid colloid in which sufficiently smaller Si particles than the pertinent wavelength are homogeneously dispersed in a uniform medium, derived according to the Maxwell-Garnett theory. A light-emitting transparent conductive multi-layered film 207, viewed from above, is round-shaped with a diameter of 500 nm. The total thickness of the light-emitting transparent conductive multi-layered film 207 is 612 nm. The uppermost non-light-emitting transparent conductor layer 206 here is expanded in the lateral direction as an upper transparent electrode 208.

The periphery of the light-emitting transparent conductive multi-layered film 207 is covered with a separating dielectric film 209 consisting of Si oxide of a low refractive index (1.44). The separating dielectric film 209 also serves as an inter-layer insulating film between the upper transparent electrode 208 and the lower reflecting electrode 202. Farther above the upper transparent electrode 208 is stacked a WSi$_2$ layer in a thickness of 15 nm as a half mirror 210. Whereas still farther above is a passivation film 211 of Si oxide of a low refractive index (1.44), immediately above the light-emitting transparent conductive multi-layered film 207 is an embedded microlens 212 consisting of Si nitride (2.0 in refractive index). This microlens 212 has a function to collimate the light having an angle of divergence emitted from the light-emitting transparent conductive multi-layered film 207 into a substantially parallel light beam.

The operation of the light-emitting device embodying the invention in this way will be described below. A positive D.C. voltage is applied to the lower reflecting electrode 202 via a resistor 213, and a negative one, to the upper transparent electrode 208. Electrons are injected from the upper transparent electrode 208 into the light-emitting transparent conductive multi-layered film 207. The non-light-emitting transparent conductor layer 206 and the tin oxide medium 203 constituting the light-emitting transparent conductive multi-layered film 207 here manifest conductivity as wide-gap n-type semiconductors, and their volume resistivity can be controlled by adjusting the density of oxygen defects.

In this embodiment, the volume resistivity of transparent conductor is set to 1.0 Ωcm for the non-light-emitting transparent conductor layer 206 consisting of TiO$_2$, and to 1000 Ωcm for the tin oxide medium 203. As the average resistivity of the Si nanoparticles 204, which make up the core of light emission, is about 100 Ωcm, electrons injected from the upper transparent electrode 208 can be preferentially let rush into the Si nanoparticles 204. Moreover, the light-emitting transparent conductive multi-layered film 207 as a whole is configured to keep the resistance-low.

The electrons injected into the light-emitting transparent conductor layer 205 rushed into the Si nanoparticles 204 dispersed within it. In the process of scattering of the injected electrons within the Si nanoparticles 204, electron-hole pairs are generated by impact ionization. The quantum efficiency of this electron-hole pair generation by impact ionization increases dependently on the kinetic energy of the injected electrons, and reaches 1 at about 4.0 eV. Where the kinetic energy of the injected electrons is high, the generated electron-hole pairs can generate electron-hole pairs of an even higher order in a cascade process.

Si is a material extremely difficult to be enabled to emit light, because it is an indirect transition semiconductor. However, recently it has become known that, by preparing Si in a shorter dimension (5 nm or less in particle size) than the de Broglie wavelength accompanying a carrier within Si at the pertinent temperature, intense light emission at room temperature can be achieved when the quantum confinement effects on the carrier has become significant. It has further been found that, as the quantum confinement effects lead to an increase in band gap due to the decrease in particle size, control of the emitted light wavelength, i.e. emission of visible lights from red to blue, can be carried out by adjusting the particle size.

Therefore, the electron-hole pairs generated within the Si nanoparticles 204 by the injection of electrons show radiative recombination at a high probability, and visible lights are emitted at room temperature at an external quantum efficiency of 0.1 to 1.0%. Moreover the emitted light wavelength is controlled according to the particle size and, at the particle size of 2 nm used in this embodiment, blue light emission of 400 nm in center wavelength is made possible.

Although tungsten silicide is used in this embodiment as the lower electrode material, either titanium silicide or cobalt silicide can be used where the requirement for low resistance is stricter.

Second Embodiment

Figure 3:
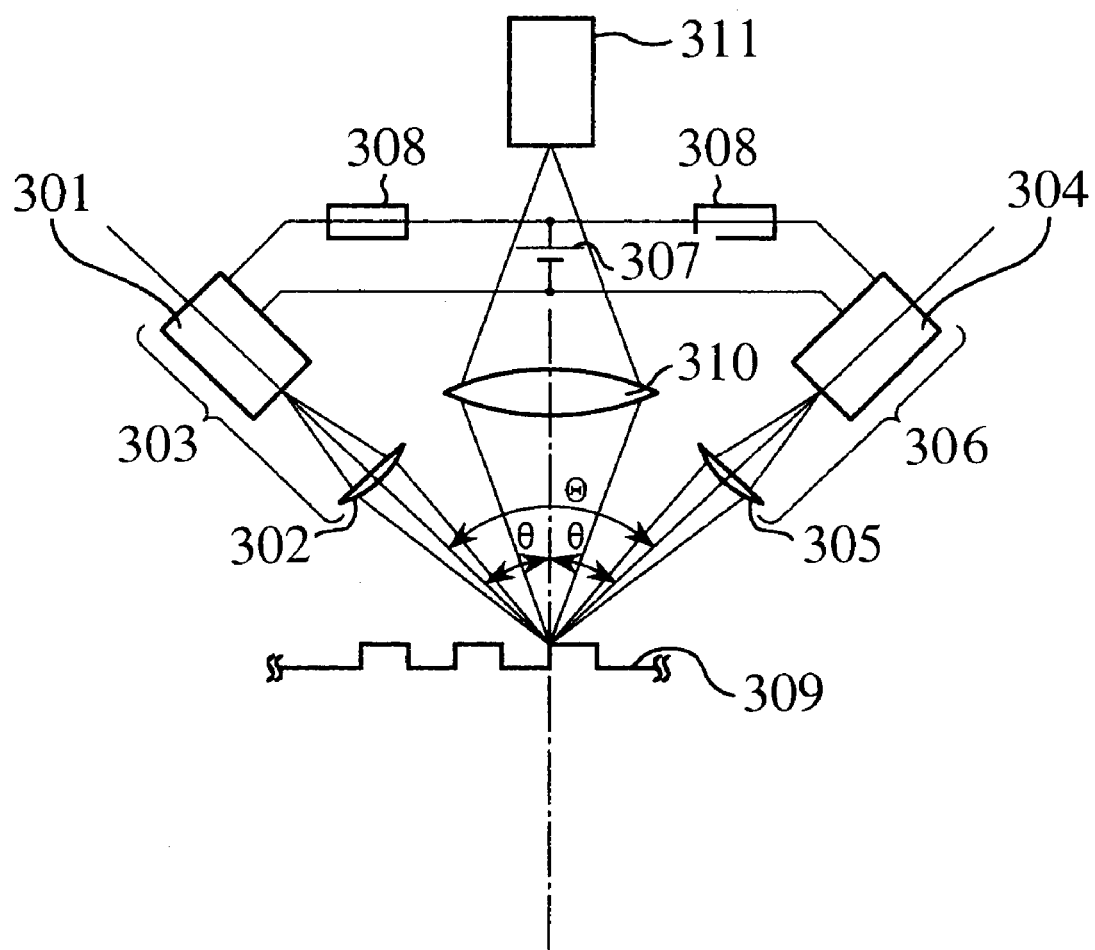
FIG. 3 illustrates the configuration of an optical pickup type optical integrated device, which is a second preferred embodiment of the invention.

Next will be described the second preferred embodiment of the present invention. FIG. 3 illustrates the configuration of an optical integrated device according to the second embodiment. In the second embodiment, a first light source unit 303 comprises a first light source 301 consisting of the monochromic and coherent small-sized light-emitting device, according to the first preferred embodiment of the invention, and a first objective microlens 302. The first objective microlens 302 has a function to condense a probe beam emitted from the first light source 301 and irradiate the surface of an object with it. This first light source unit 303 exerts a desired sophisticated function by being paired with a second light source unit 306 of the same structure. Thus, when the probe beam emitted from the first light source unit 303 is condensed and irradiates the object surface (an optical disk surface 309 in this case), it comes incident at an angle θ to the perpendicular axis of the optical disk surface 309.

On the other hand, the second light source unit 306 is arranged in a position symmetric to the first light source unit 303 with respect to the perpendicular axis, and the probe beam from here also comes incident at an angle θ to the perpendicular line of the optical disk surface 309, and irradiates the same point as the irradiation point of the first light source unit 303. Therefore, the angle formed between the probe beam from the first light source unit 303 and that from the second light source unit 306 is 2θ=Θ.

In the configuration here, the first light source unit 303 and the second light source unit 306 are exactly symmetrical (their light sources and objective lenses are of exactly the same standard and specification, and arranged in exactly the same configuration). The first light source 301 and the second light source 304 receive power supply from a common D.C. source 307 via a resistor 308 for setting a bias potential.

On the optical disk surface 309 are formed ups and downs of submicron size, and the diffracted light intensity of the probe beam condensed and irradiating here is detected by a condenser lens 310 and an optical detector 311 (the diffracted light intensity varies with whether the irradiation point is higher or lower than the surrounding). Here, in order to achieve a high recording intensity, it is required to reduce the worked size of ups and downs (currently available DVDs have a recording width of about 0.4 μm) and to provide irradiating optical lines of probe beams capable of spatially resolving these ups and downs. In order to obtain irradiating optical lines capable of high space resolution, the basic requirements are, first, to shorten the wavelengths of light sources according to Equation (1) cited above and, second, to provide objective lenses of large diameters.

However, to meet the first requirement of shortening the wavelengths of light sources, it is still difficult to make the ultraviolet region available for practical use. The difficulties include the cost aspect of semiconductor lasers, such as solid light-emitting device. Even if reasonably inexpensive solid light-emitting devices themselves become available, there still will be a difficulty with micro-optic materials highly transmissive in the ultraviolet region. On the other hand, regarding the second requirement of introducing objective lenses of large diameters, such lenses themselves involve size, cost and assembling constraints.

In view of these problems, in this embodiment, two micro-size monochromic and coherent light sources, like the one in the first embodiment, are paired in an opposite arrangement, and each individual light source is at a relatively small angle of elevation (70 degrees or less) from the optical disk plane. This optical configuration in which two probe beams come incident on an irradiation point on the object surface (the optical disk surface 309 here) symmetrically with respect to the perpendicular axis results in simulation of the use of objective lenses of large diameters on the irradiating optical lines, moreover accompanied by ring belts in the pupil areas of the lenses to use as irradiating optical lines only the refracted lights from the peripheral areas of lenses where the angle of elevation of incidence is small. This is a very effective way to enhance the space resolutions of the irradiating optical lines. Thus, the numerical aperture NA can be expressed in the following Equation (2) as the function of the angle θ formed between the incident probe beam and the perpendicular axis:

$$NA = \sin\theta \qquad (2)$$

Therefore, to put Equation (2) together with Equation (1), even if the wavelength of the incident probe beam is fixed, an arrangement to secure a large angle between the beam and the perpendicular line (i.e. to keep the angle of elevation small), a high level of space resolution (d) can be achieved. For instance, if the angle θ is secured at 45.0 degrees, an optical system whose numerical aperture NA is equivalent to 0.7 can be obtained.

Since the first and second light sources, first and second objective microlenses and the like in this second embodiment are integrally formed in a monolithic process, there can be no error in arrangement positions at the time of assembling. Therefore, although paired two probe beam lines are used, it is possible to set the wavefront aberration between them extremely small.

Third Embodiment

Figure 4:
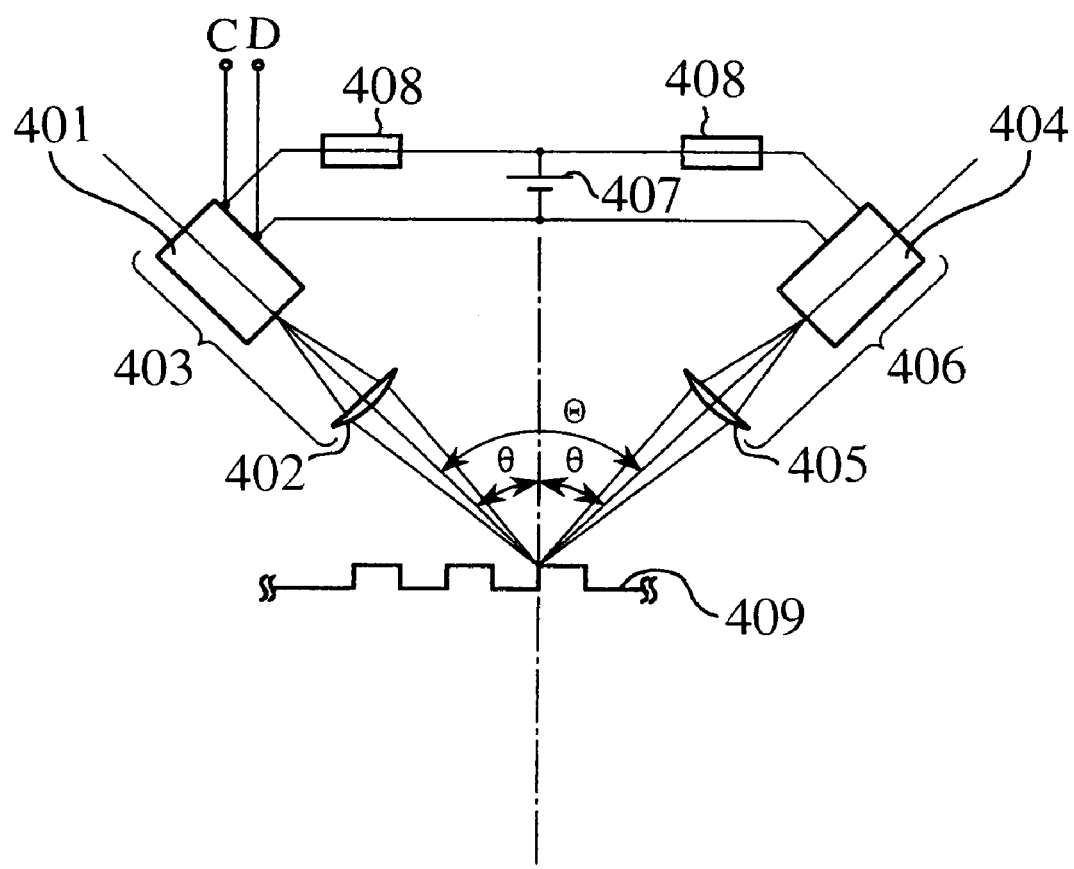
FIG. 4 illustrates the configuration of an optical pickup type optical integrated device, which is a third preferred embodiment of the invention.

FIG. 4 illustrates the configuration of an optical integrated device, which is a third preferred embodiment of the invention. This third embodiment is configured of a first light source 401 consisting of the monochromic and coherent small-sized light-emitting device and a first objective microlens 402 together constituting a first light source unit 403. The first objective microlens 402 has a function to condense a probe beam emitted from the first light source 401 and irradiate the surface of an object with it. This first light source unit 403 exerts a desired sophisticated function by being paired with a second light source unit 406 of the same structure. Thus, when the probe beam emitted from the first light source unit 403 is condensed and irradiates the object surface (an optical disk surface 409 in this case), it comes incident at an angle θ to the perpendicular axis of the optical disk surface 409. On the other hand, the second light source unit 406 is arranged in a position opposite the first light source unit 403, and the probe beam from here also comes incident at an angle θ to the perpendicular line of the optical disk surface 409, and irradiates the same point as the irradiation point of the first light source unit 403. Therefore, the angle formed between the probe beam from the first light source unit 403 and that from the second light source unit 406 is 2θ=Θ. In the configuration here, the first light source unit 403 and the second light source unit 406 are exactly symmetrical (their light sources and objective lenses are of exactly the same standard and specification, and arranged in exactly the same configuration). The first light source 401 and the second light source 404 receive power supply from a common D.C. source 407 via a resistor 408 for setting a bias potential.

On the optical disk surface 409 are formed ups and downs of submicron size, and lights resulting from the reflection, scattering and diffraction of the two symmetric lines of probe beams condensed and irradiated here are condensed onto the probe beam emitting points of the light sources 401 and 404 via the objective microlenses 402 and 405. Further, the reflected, scattered and diffracted lights are fed back to active regions in the light sources 401 and 404. The entering of lights of around 400 nm in center wavelength into the active regions in the light sources 401 and 404 from outside induces effects on the operation of elements including, first, reinforcement of the induced emission lights and, second, generation of electron-hole pairs to serve as carriers. These first and second effects in the solid light source devices can be detected as a variation (drop) in potential between C and D (D.C. power introducing terminals of the light source 401) shown in FIG. 4.

The feedback intensity of reflected, scattered and diffracted lights to a region in a light source varies with whether the irradiation point is higher or lower than the surrounding. Obviously, in order to achieve a high recording density, the worked size of ups and downs tends to be made ever finer (currently available DVDs have a recording width of about 0.4 μm). In this embodiment, two monochromic and coherent small light sources, which may typically be semiconductor laser chips or photonic crystal light-emitting devices, are paired and arranged at a relatively small angle of elevation (70 degrees or less) from the optical disk plane. This optical configuration in which two probe beams come incident on an irradiation point on the object surface (the optical disk surface 409 here) symmetrically with respect to the perpendicular axis results in simulation of the use of large-diameter objective lenses on the irradiating optical lines, and the use of ring belts disposed in the pupil areas of the lenses so that only the refracted lights from the peripheral areas of lenses are used as irradiating optical lines. This is a very effective way to enhance the space resolutions of the irradiating optical lines.

Thus this embodiment employs an optical system in which lights resulting from the reflection, scattering and diffraction of the irradiating probe beams are condensed and fed back to the exit holes of the light sources. As the exit holes of the light sources here are, so to speak, pinholes of not more than 500 μm in diameter, the optical systems for light radiation and detection constitute a confocal optical system, which can contribute to further enhancement of space resolution.

Also for this embodiment, since the first and second light sources, first and second objective microlenses and the like in this third embodiment are integrally formed in a monolithic process, there can be no error in arrangement positions at the time of assembling. Therefore, although paired two probe beam lines are used, it is possible to set the wavefront aberration between them extremely small.

Fourth Embodiment

Figure 5:
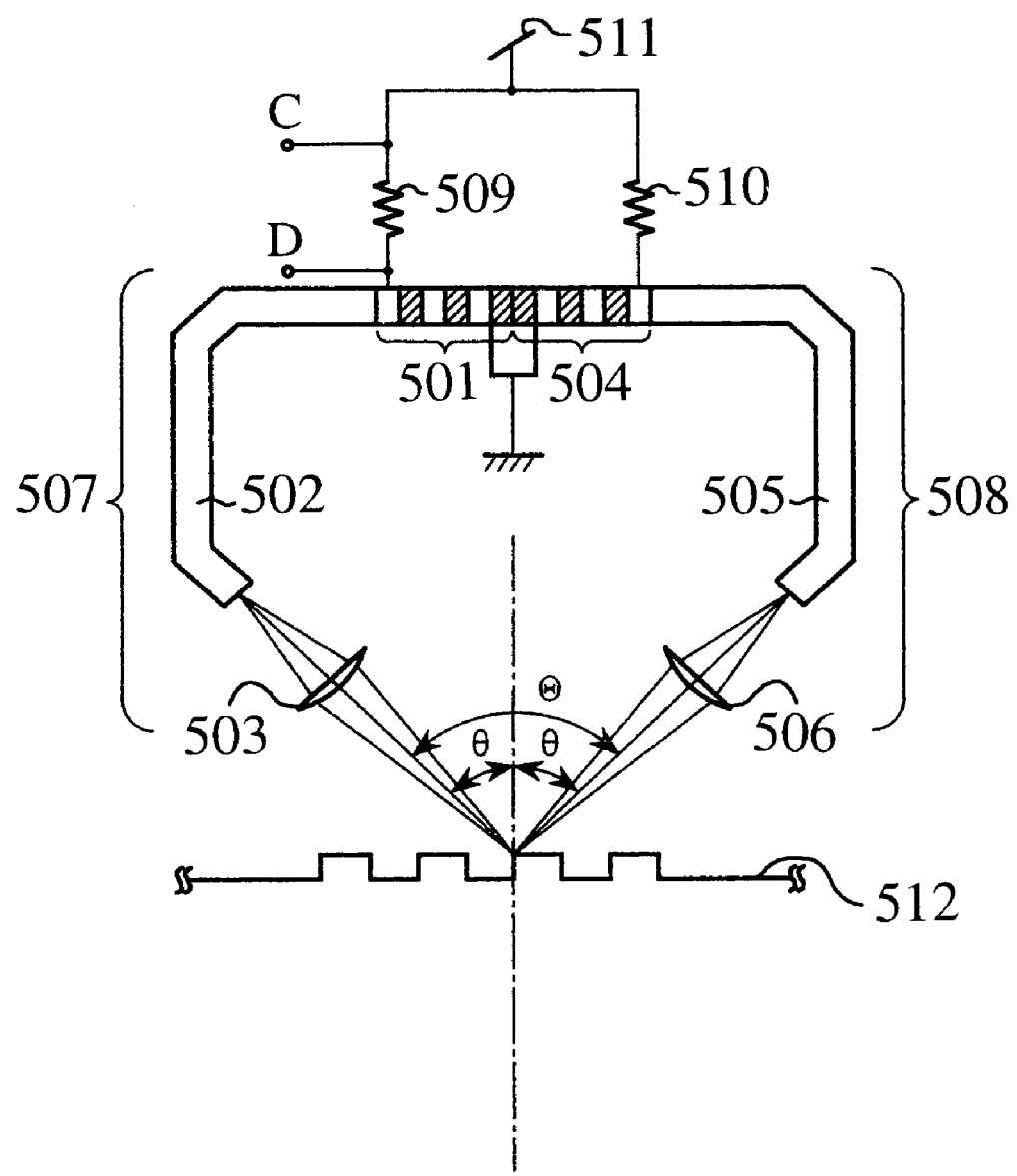
FIG. 5 illustrates the configuration of an optical pickup type optical integrated device, which is a fourth preferred embodiment of the invention.

Next will be described the fourth preferred embodiment of the present invention. FIG. 5 illustrates the configuration of an optical integrated device, which is the fourth embodiment. In this embodiment a first light source 501, consisting of a monochromic and coherent small light-emitting device which may typically be a semiconductor laser chip or a photonic crystal light-emitting device, is connected to a first optical waveguide 502. A first objective microlens 503 has a function to condense a probe beam emitted from the first light source 501 and having passed an optical waveguide 502 and to irradiate the surface of an object with it. This first probe beam irradiating optical system 507 exerts a desired sophisticated function by being paired with a second probe beam irradiating optical system 508 of the same structure. Thus, when the probe beam emitted from the first probe beam irradiating optical system 507 is condensed and irradiates the object surface (an optical disk surface 512 in this case), it comes incident at an angle θ to the perpendicular axis of the optical disk surface 512. On the other hand, the second probe beam irradiating optical system 508 is arranged in a position opposite the first probe beam irradiating optical system 507, and the probe beam from here also comes incident at an angle θ to the perpendicular line of the optical disk surface 512, and irradiates the same point as the irradiation point of the first probe beam irradiating optical system 507. Therefore, the angle formed between the probe beam from the first probe beam irradiating optical system 507 and that from the second probe beam irradiating optical system 508 is 2θ=Θ. In the configuration here, the first probe beam irradiating optical system 507 and the second probe beam irradiating optical system 508 are exactly symmetrical (their light sources and objective lenses are of exactly the same standard and specification, and arranged in exactly the same configuration). The first light source 501 and the second light source 504 receive power supply in parallel from a common D.C. source 511 via resistors 509 and 510 for setting bias potentials.

On the optical disk surface 512 are formed ups and downs of submicron size, and lights resulting from the reflection, scattering and diffraction of the two symmetric lines of probe beams condensed and irradiated here are condensed onto the probe beam emitting points of optical waveguides 502 and 505 via objective microlenses 503 and 506. The reflected, scattered and diffracted lights, transmitted in the reverse direction over the waveguides 502 and 505, are fed back to active regions in the light sources 501 and 504. The entering of lights of around 400 nm in center wavelength into the active regions in the light sources 501 and 504 from outside induces effects on the operation of devices including, first, reinforcement of the induced emission lights and, second, generation of electron-hole pairs to serve as carriers. These first and second effects in the solid light source devices can be detected as a variation (drop) in potential between C and D (D.C. power introducing terminals of the light source 501) shown in FIG. 5.

The feedback intensity of reflected, scattered and diffracted lights to a region in a light source varies with whether the irradiation point is higher or lower than the surrounding. Obviously, in order to achieve a high recording density, the worked size of ups and downs tends to be made ever finer (currently available DVDs have a recording width of about 0.4 μm). In this embodiment, two monochromic and coherent small light sources, which may typically be semiconductor laser chips or photonic crystal light-emitting devices, are paired and arranged at a relatively small angle of elevation (70 degrees or less) from the optical disk plane. This optical configuration in which two probe beams come incident on an irradiation point on the object surface (the optical disk surface 512 here) symmetrically with respect to the perpendicular axis results in simulation of the use of objective lenses of large diameters on the irradiating optical lines, moreover accompanied by ring belts in the pupil areas of the lenses to use as irradiating optical lines only the refracted lights from the peripheral areas of lenses. This is a very effective way to enhance the space resolutions of the irradiating optical lines.

Thus this embodiment uses an optical system in which lights resulting from the reflection, scattering and diffraction of the irradiating probe beams are condensed and fed back to the exit holes of the optical waveguides. As the exit holes of the light sources here are, so to speak, pinholes of not more than 500 μm in diameter, the optical systems for light radiation and detection constitute a confocal optical system, which can contribute to further enhancement of space resolution.

For this embodiment, too, since the first and second light sources, first and second objective microlenses and the like in this fourth embodiment are integrally formed in a monolithic process, there can be no error in arrangement positions at the time of assembling. Therefore, although paired two probe beam lines are used, it is possible to set the wavefront aberration between them extremely small.

While the present invention has been described with reference to preferred embodiments illustrated in accompanying drawings, it must be evident to persons skilled in the art that the invention can be readily altered or modified, and such alterations and modifications are also included in the scope of the invention.

What is claimed is:

1. An optical integrated device having a configuration wherein an irradiation point is defined on an object surface; two probe light irradiating lines symmetrical with respect to a perpendicular line starting from this irradiation point are provided; and said two probe light lines reach and come incident on the irradiation point at a prescribed angle to each other; lights resulting from the reflection, scattering and diffraction of said probe lights from the object surface being condensed and re-introduced into light sources belonging to said probe light irradiating lines to be fed back to and detected in an active region.

2. The optical integrated device, as claimed in claim 1, having an optical pickup function.

3. An optical integrated device comprising: a first probe light irradiating line so configured that a probe light from a first light source is introduced into an optical waveguide and transmitted, comes incident via an objective lens obliquely at a prescribed angle to a perpendicular axis to an object surface and reaches an irradiation point; and a second probe light irradiating optical line having the same configuration as this first probe light irradiating line, and the optical integrated device having a configuration in which: these first probe light irradiating line and second probe light irradiating optical line are arranged in symmetric positions with respect to said perpendicular axis; and the two probe lights reach said irradiating point, wherein lights resulting from the reflection, scattering and diffraction of said probe lights from the object surface are condensed and re-introduced into light sources belonging to said probe light irradiating lines to be fed back to and detected in an active region.

4. The optical integrated device, as claimed in claim 3, having an optical pickup function.

* * * * *